(12) United States Patent
Witte et al.

(10) Patent No.: US 11,038,522 B1
(45) Date of Patent: Jun. 15, 2021

(54) OFFSET COMPENSATION IN ADC CIRCUITRY

(71) Applicant: NXP B.V., Eindhoven (NL)

(72) Inventors: Johan Frederik Witte, Delft (NL); Lucien Johannes Breems, Waalre (NL); Robert Rutten, Nistelrode (NL); Muhammed Bolatkale, Delft (NL); Johannes Hubertus Antonius Brekelmans, Nederweert (NL); Shagun Bajoria, Eindhoven (NL); Albertus Willibrordus Oude Essink, Gouda (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/779,976

(22) Filed: Feb. 3, 2020

(51) Int. Cl.
*H03M 1/06* (2006.01)
*H03M 3/00* (2006.01)

(52) U.S. Cl.
CPC ........... *H03M 3/356* (2013.01); *H03M 3/424* (2013.01); *H03M 3/458* (2013.01)

(58) Field of Classification Search
CPC ...... H03M 3/356; H03M 3/458; H03M 3/424; H03M 1/12; H03M 1/06; H03M 1/1023
USPC .................................................. 341/118, 155
See application file for complete search history.

(56) References Cited

U.S. PATENT DOCUMENTS

| | | | |
|---|---|---|---|
| 5,864,310 A | 1/1999 | Khorramabadi | |
| 7,129,866 B2 * | 10/2006 | Bjornsen | H03M 3/35 341/118 |
| 7,176,822 B2 * | 2/2007 | Schimper | H03M 1/0665 341/120 |
| 9,344,104 B1 * | 5/2016 | Schafferer | H03F 3/24 |
| 9,531,398 B2 * | 12/2016 | Ferguson | G01R 31/2642 |
| 9,602,121 B2 * | 3/2017 | Ali | H03M 1/361 |
| 9,843,337 B1 * | 12/2017 | Li | H03M 1/12 |
| 2005/0275571 A1 * | 12/2005 | Bjornsen | H03M 3/35 341/119 |
| 2016/0134302 A1 * | 5/2016 | Schafferer | H03F 1/3247 341/120 |

* cited by examiner

*Primary Examiner* — Jean B Jeanglaude
(74) *Attorney, Agent, or Firm* — Rajeev Madnawat

(57) ABSTRACT

An apparatus including analog-to-digital conversion (ADC) circuitry is disclosed. The apparatus includes a plurality of comparators susceptible to offset variation and a shuffler circuit configured to shuffle input sources to the respective comparators. Feedback circuitry is also included and is configured and arranged with the ADC circuitry to detect offset variation in the outputs of each comparators for the shuffled inputs, relative to outputs of the plurality of comparators and compensate for the offset variation in the comparators based on the offset differences between the respective comparators.

20 Claims, 4 Drawing Sheets

OFFSET COMPENSATION IN ADC CIRCUITRY

OVERVIEW

Aspects of various embodiments are directed to compensating for offset variation, which may be utilized in an analog to digital converter (ADC).

Various circuits are susceptible to offset variation. For instance, in applications such as analog and digital radio, base stations and radar, high speed, high accuracy, high linearity and medium bandwidth analog-to-digital converters (ADCs) may be utilized. A delta-sigma modulator is a suitable architecture for such an ADC. In some instances, such a delta-sigma modulator may be clocked at a high sampling rate in the order of a few GHz. To reduce the sampling frequency and lower the oversampling ratio, a multibit topology may be utilized. However, this multibit approach may introduce non-linear behavior due to mismatch and offset voltages in the multi-bit elements of the various blocks.

These and other matters have presented challenges to efficiencies of circuit implementations for a variety of applications, such as in ADC circuitry.

SUMMARY

Various example embodiments are directed to issues such as those addressed above and/or others that may become apparent from the following disclosure concerning offset variation in respective circuits and compensation therefor. In certain example embodiments, aspects of the present disclosure involve detecting and compensating for offset variation in comparators utilized in ADC circuitry. Such approaches may improve linearity of circuitry, such as flash ADC circuitry, used as a multibit quantizer for a delta-sigma ADC.

An apparatus includes analog-to-digital conversion (ADC) circuitry, and feedback circuitry. The ADC circuitry includes a plurality of comparators susceptible to offset variation and a shuffler circuit configured to shuffle input sources to the respective comparators. The feedback circuitry is configured and arranged with the ADC circuitry to detect offset variation in the outputs of each comparator for the shuffled inputs, relative to outputs of the plurality of comparators, and to compensate for the offset variation in the comparators based on the offset differences between the respective comparators.

In another specific example embodiment, a method is carried out as follows. In analog-to-digital conversion (ADC) circuitry including a plurality of comparators susceptible to offset variation and a shuffler circuit, using the shuffler circuit to shuffle input sources to the respective comparators. In feedback circuitry, detecting offset variation in the outputs of each comparators for the shuffled inputs, relative to outputs of the plurality of comparators. The offset variation in the comparators is compensated, via the feedback circuitry, based on the offset differences between the respective comparators.

Another embodiment is carried out as follows. Quantizer reference levels of respective comparators of a quantizer in a delta sigma analog-to-digital converter (ADC) are randomly shuffled. Offset in the comparators is compensated by providing, for each comparator, an auxiliary offset input to the comparator based on an offset of the comparator and an average offset of the comparators. In some implementations, compensating for the offset in each of the comparators includes removing offset differences between the comparators and removing noise generated via the random shuffling.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
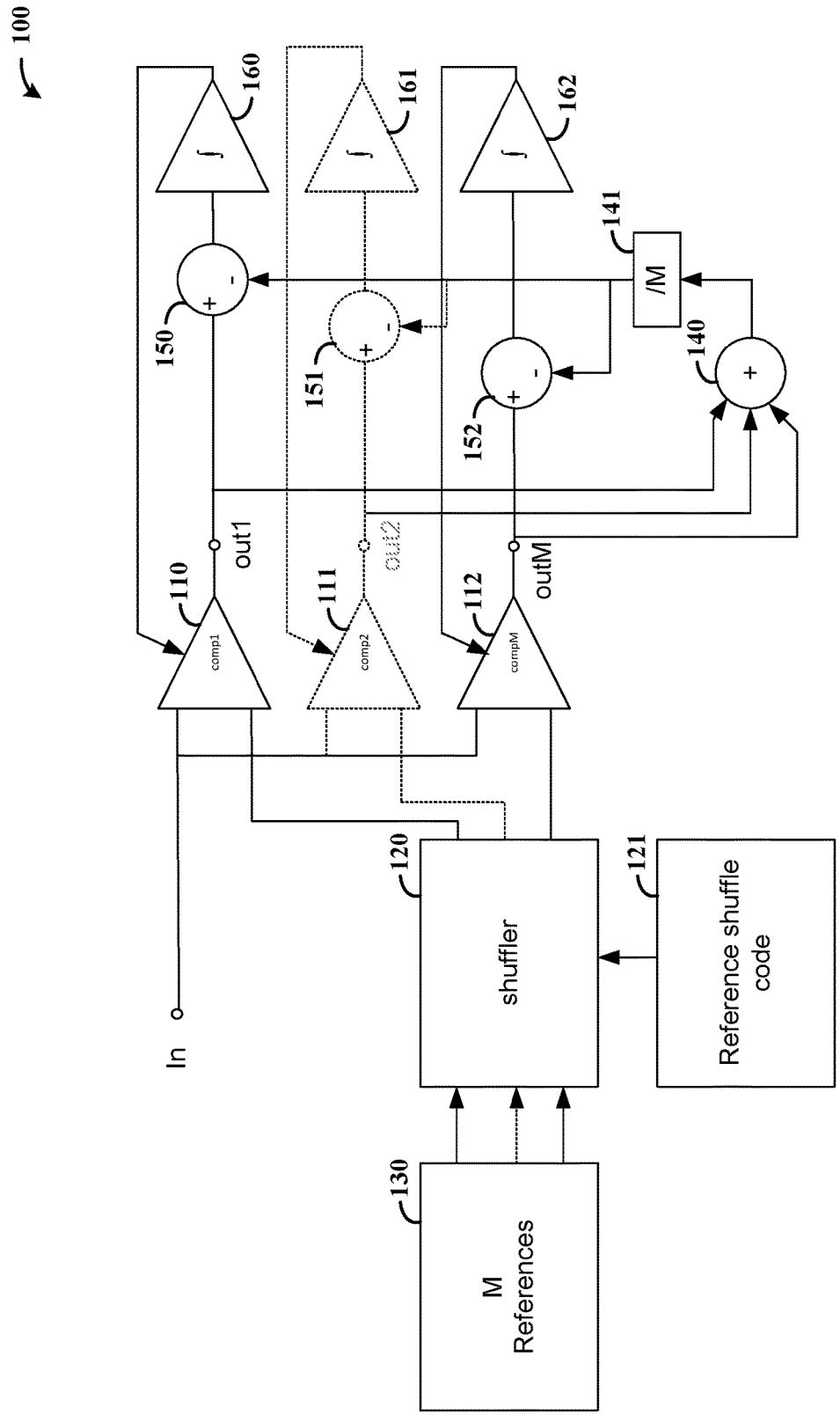
FIG. 1 shows a circuit-based apparatus for offset compensation, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving compensating for offset variation in circuits, such as by compensating for offset variation between respective comparators. In certain implementations, aspects of the present disclosure have been shown to be beneficial when used in the context of ADC circuitry, in which offset variation in of respective comparators (e.g., utilized with a quantizer) may be compensated. In some embodiments, feedback can be utilized to adjust respective comparators in an ADC to mitigate variation between outputs of the respective comparators. Certain embodiments are further directed o compensating for an offset common to respective comparators. Other embodiments are further directed to adding a common offset (e.g., dither) to respective comparators. Accordingly, various aspects of the disclosure may be used to linearize high-speed flash ADC convertors and use them as a quantizer in linear multibit delta-sigma modulator ADCs. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed to a linearization technique in an N-bit ADC quantizer. Such an approach may be useful for improving a delta sigma ADC in which the quantizer is utilized. Dynamic element matching may be carried out by randomly shuffling quantizer reference levels, and compensating for offset noise in comparators of the quantizer as they are interchanged over time. For instance, an N-bit quantizer may be implemented as a flash ADC and having $M=2^N-1$ comparators, in which a shuffling technique ensures that M comparators are used at M levels randomly distributed over time. The offset differences between comparators can be measured, with digital outputs of the comparators being averaged and utilized to characterize offset in each comparator. Offset differences in the comparators can be compensated by providing auxiliary offset compensating inputs to each comparator, with these inputs being controlled based on the average. Accordingly, offset differences can be removed along with unwanted noise.

Various embodiments are directed to compensating for non-linearity in multibit ADCs, which may stem from mismatches in manufacturing processes, and which may relate to different sources of offset. Compensation for such non-linearities may involve mitigation of harmonics in higher bit ADCs, and may be carried out in embodiments in which offset sources of individual comparators are shuffled (e.g., randomly or pseudo randomly) over time, such as to mitigate increases in linearity in an oversampled system in which the samples are averaged over time. For instance, in embodiments involving a delta-sigma modulators, such compensation may involve mitigating instabilities that result from shuffled unknown offset differences between comparators that may otherwise lead to an unknown noise source. Accordingly, offset is measured and compensated in such applications, in accordance with various embodiments.

Another embodiment is directed to an apparatus having ADC circuitry (e.g., including a multi-bit ADC quantizer) and feedback circuitry that operates to compensate for offset in comparators of the ADC circuitry which are susceptible to offset variation, relative to a shuffler circuit that shuffles input sources to the respective comparators. The feedback circuitry operates with the ADC circuitry to detect offset variation in the outputs of each comparator for the shuffled inputs, relative to outputs of the plurality of comparators, and compensates for the offset variation based on the offset differences between the respective comparators. The shuffler circuit may, for example, randomly or pseudo-randomly shuffle the input sources to the respective comparators. In certain embodiments, the apparatus also has dither circuitry configured to add a known dither signal to the ADC circuitry.

The feedback circuitry may operate in a variety of manners and employ various circuitry, to suit particular embodiments. In some embodiments, the feedback circuitry operates with the ADC circuitry to detect the offset variation in the output of each comparator by averaging the outputs of the plurality of comparators and determining the offset variation of each comparator as a difference between the output of the comparator and the averaged outputs. In certain implementations, the feedback circuitry operates with the ADC circuitry to compensate for the offset variation by, for each comparator, generating a feedback signal based on the detected offset variation for the comparator and using the feedback signal to compensate for the offset variation in the comparator.

In a particular implementation, the feedback circuitry operates with the ADC circuitry to compensate for residue offset common to the plurality of comparators by generating a feedback signal for each comparator based on the detected offset variation for that comparator and the residue offset. This may involve, for example, detecting an amount of residue offset based on signal characteristics in a portion of the ADC circuitry that is different from the comparators, and compensating for the detected residue offset. In certain implementations, this residue offset compensation may involve a feedback comparator that is coupled to receive an input signal provided to the plurality of comparators, and an integrator coupled to receive an output of the feedback comparator. The feedback circuitry is configured to detect the residue offset in the apparatus using an output of the integrator.

In a more particular embodiment, the feedback circuitry includes an adder circuit that adds the outputs of the plurality of comparators, and a divider circuit that divides the added outputs by the number of comparators to provide an average value. The feedback circuitry also includes, for each comparator, summing circuitry and integrator circuitry. The summing circuitry detects the offset variation in the comparator based on an output of the comparator and the average value, and provides an output based on the offset variation. The integrator circuitry integrates the output of the summing circuitry and provides the integrated output to the comparator as a feedback signal that adjusts the comparator to compensate for the offset variation.

Various method-based approaches may be carried out in accordance with one or more embodiments here, as may include aspects of the apparatus-based embodiments and the apparatuses shown in the figures. In a specific example embodiment, input sources are shuffled to respective comparators in analog-to-digital conversion (ADC) circuitry having a plurality of such comparators that are susceptible to offset variation. The shuffling may include randomly or pseudo-randomly shuffling the input sources to the respective comparators. The offset variation in the outputs of each comparator is detected for the shuffled inputs, relative to outputs of the plurality of comparators, and is compensated based on the offset differences between the respective comparators. This approach may, for example be carried out using shuffler circuitry in the ADC and feedback circuitry that detects and compensates for the offset variation. The offset variation may be detected by averaging the outputs of the comparators and determining the offset variation of each comparator as a difference between the output of the comparator and the averaged outputs. Compensating for the offset variation may include, for each comparator, generating a feedback signal based on the detected offset variation for the comparator and using the feedback signal to adjust the comparator. In certain embodiments, a known dither signal may be added to the ADC circuitry.

In a more particular embodiment, residue offset common to the plurality of comparators is compensated for, by generating a feedback signal for each comparator based on the detected offset variation for that comparator and the residue offset. In some implementations, this involves detecting an amount of residue offset based on signal characteristics in a portion of the ADC circuitry that is different from the comparators, and compensating for the detected residue offset in the comparators. In certain implementations, offset in a feedback comparator coupled to receive an input signal provided to the plurality of comparators is detected and used to characterize the residue offset.

Turning now to the figures, FIG. 1 shows a circuit-based apparatus 100 for offset compensation, in accordance with the present disclosure. The apparatus 100 includes a plurality of comparators 110-112, three being shown by way of example with the understanding that fewer (2) or more (a total of "M") such comparators may be utilized in accordance with various embodiments. The comparators are coupled to receive a shuffled input from a shuffling circuit 120, which shuffles input references (e.g., a total of "M" references) at 130 according to a reference shuffling code input 121. Outputs of the comparators are provided to an adder circuit 140 that adds output values of the comparators, and a divider circuit 141 that divides the added output values by the number of the comparators. The output of the divider circuit 141 is used with the respective outputs of the comparators to determine an offset for each comparator at summing circuitry 150, 151 and 152. This offset may be used as a feedback loop with integrators (or other type of filter, such as a filter having a transfer similar to an integrator transfer) 160, 161 and 162 to generate respective compensation inputs that are provided to comparators 110-112 as shown.

In some implementations, the number of high and low decisions of the individual comparators 110-112 are counted and processed via the adder circuit 140 and divider circuit 141. The feedback loop may measure the number of high decisions (+1) and low decisions (−1) of each comparator via the summing circuitry 150-152 and integrators 160-162, with feedback outputs of the integrators driving auxiliary inputs of the comparators 110-112. The common offset which all comparators measure may thus be subtracted by subtracting the sum of all comparator decisions divided by the number of elements from the output of each individual comparator, and the result may be integrated. When the integrators reach a steady state condition, the offsets may be optimally compensated. This feedback approach may be implemented in the analog or digital domain.

The apparatus 100 depicted in FIG. 1 can also be used to linearize a flash ADC. The accuracy of the integrator and auxiliary input of the comparator may determine residual offset differences, which may limit the linearity of a non-oversampled flash ADC. When implemented with an oversampled ADC, the residual offset differences may be shuffled and averaged out. Such approaches may be used with an introduction of a known offset/dither, as may be facilitated via the use of circuitry shown in FIG. 3 and characterized herein.

Figure 2:
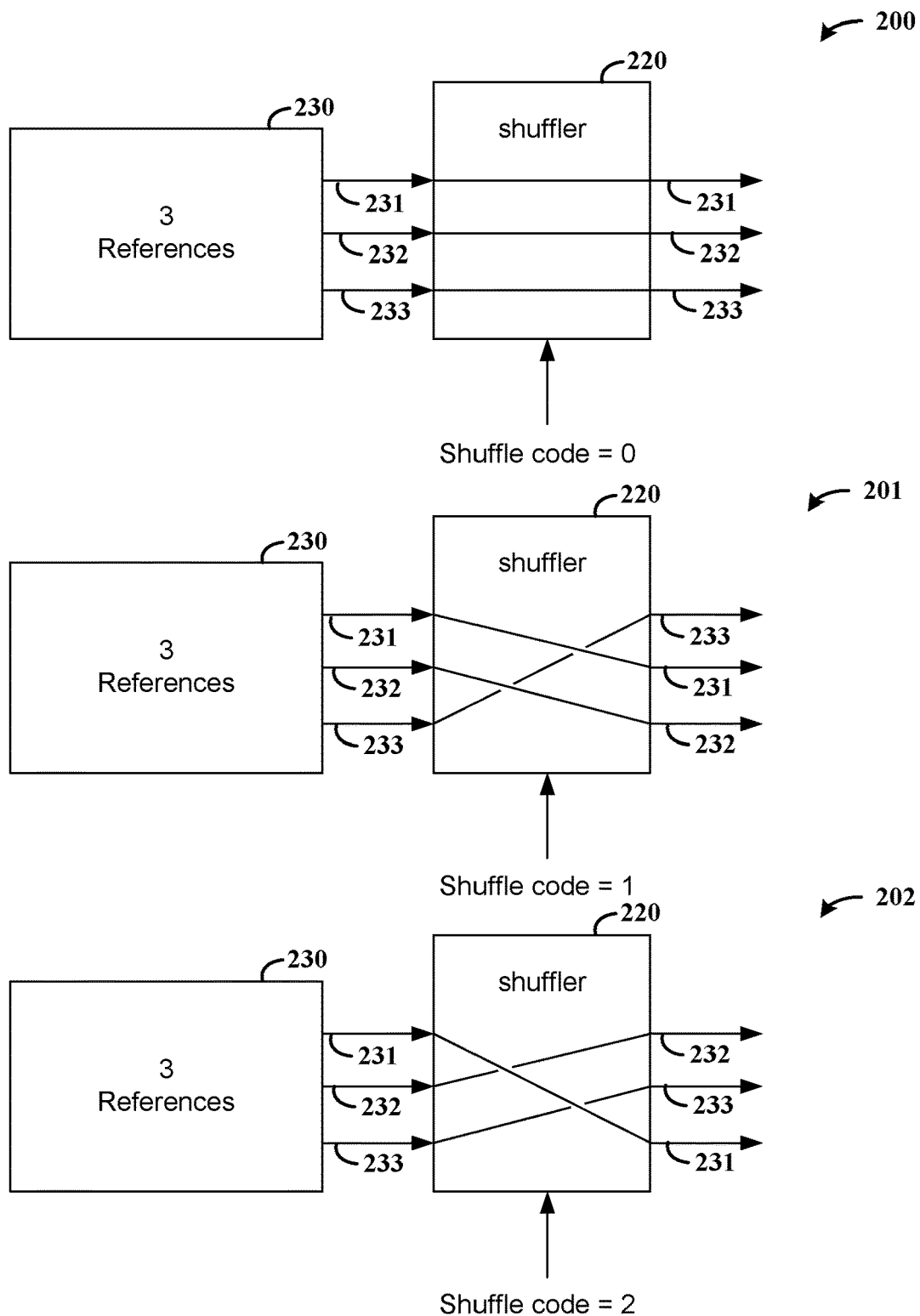
FIG. 2 shows an apparatus and approach for shuffling signals, in accordance with the present disclosure.

FIG. 2 shows an apparatus and approach for shuffling signals with three different shuffle code inputs, in accordance with the present disclosure. The apparatus includes a shuffler 220 with a reference input (e.g., circuit) 230 and may be implemented, for example, with approaches shown in other figures such as with shuffler circuit 120 and input references 130 of FIG. 1. The shuffler circuit 120 shuffles inputs 231, 232 and 233 according to an input shuffle code, with code "0" being applied at 200, code "1" being applied at 201, and code "2" being applied at 202.

The inputs may then be fed to respective comparators, shuffled as shown. For instance, using FIG. 1 as an example with shuffle code "0" in scenario 200, inputs 231, 232 and 233 may be respectively provided to comparators 110, 111 and 112. With shuffle code "1" in scenario 201, inputs 233, 231 and 232 may be respectively provided to comparators 110, 111 and 112. With shuffle code "2" in scenario 202, inputs 232, 233 and 231 may be respectively provided to comparators 110, 111 and 112. A corresponding quantizer output may be derived from counting the number of comparators that have a low or high output.

Figure 3:
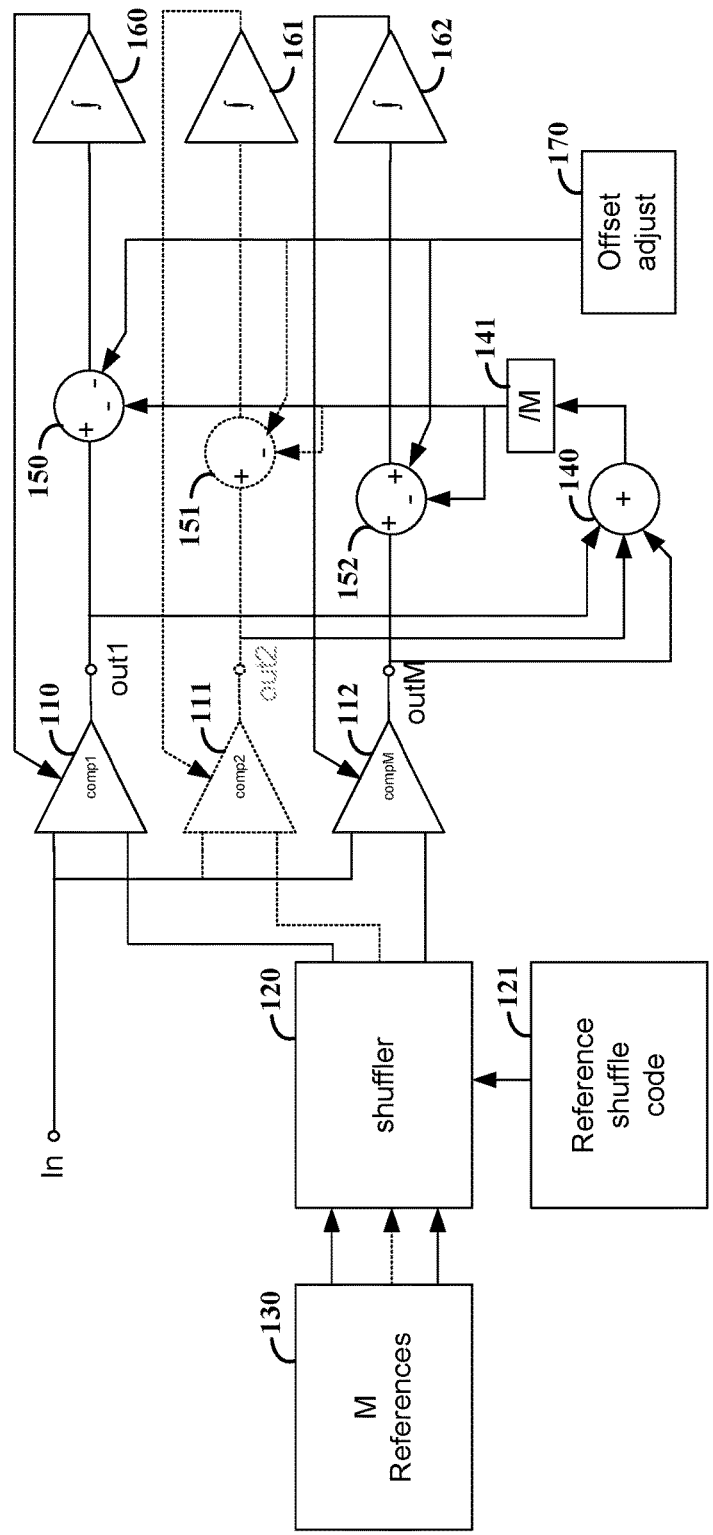
FIG. 3 shows a circuit-based apparatus for offset compensation, in accordance with the present disclosure.

FIG. 3 shows a circuit-based apparatus 300 for offset compensation, in accordance with the present disclosure. As noted above, the apparatus 300 may be implemented in accordance with the apparatus 100 depicted in FIG. 1 and with similar circuitry. Accordingly, similar reference numbers are used to depict similar circuitry, the description thereof being omitted for brevity. The apparatus 300 also includes an offset adjustment circuit 370, which is utilized to add a known offset (and there adding dither) to the summing circuitry 150, 151 and 152. Such an approach may be utilized with a quantizer in a delta-sigma modulator. Further, while the known offset is shown being used to adjust the 110 and 112 in opposite directions, other approaches may be utilized (including adjusting the comparator 111). For general information regarding dither, and for specific information regarding dither characteristics as may be implemented with one or more embodiments herein, reference may be made to L. Schuchman, "Dither Signals and Their Effect on Quantization Noise," IEEE Trans. Commun. 12 (4): 162-165 (December 1964), which is fully incorporated herein by reference.

Figure 4:
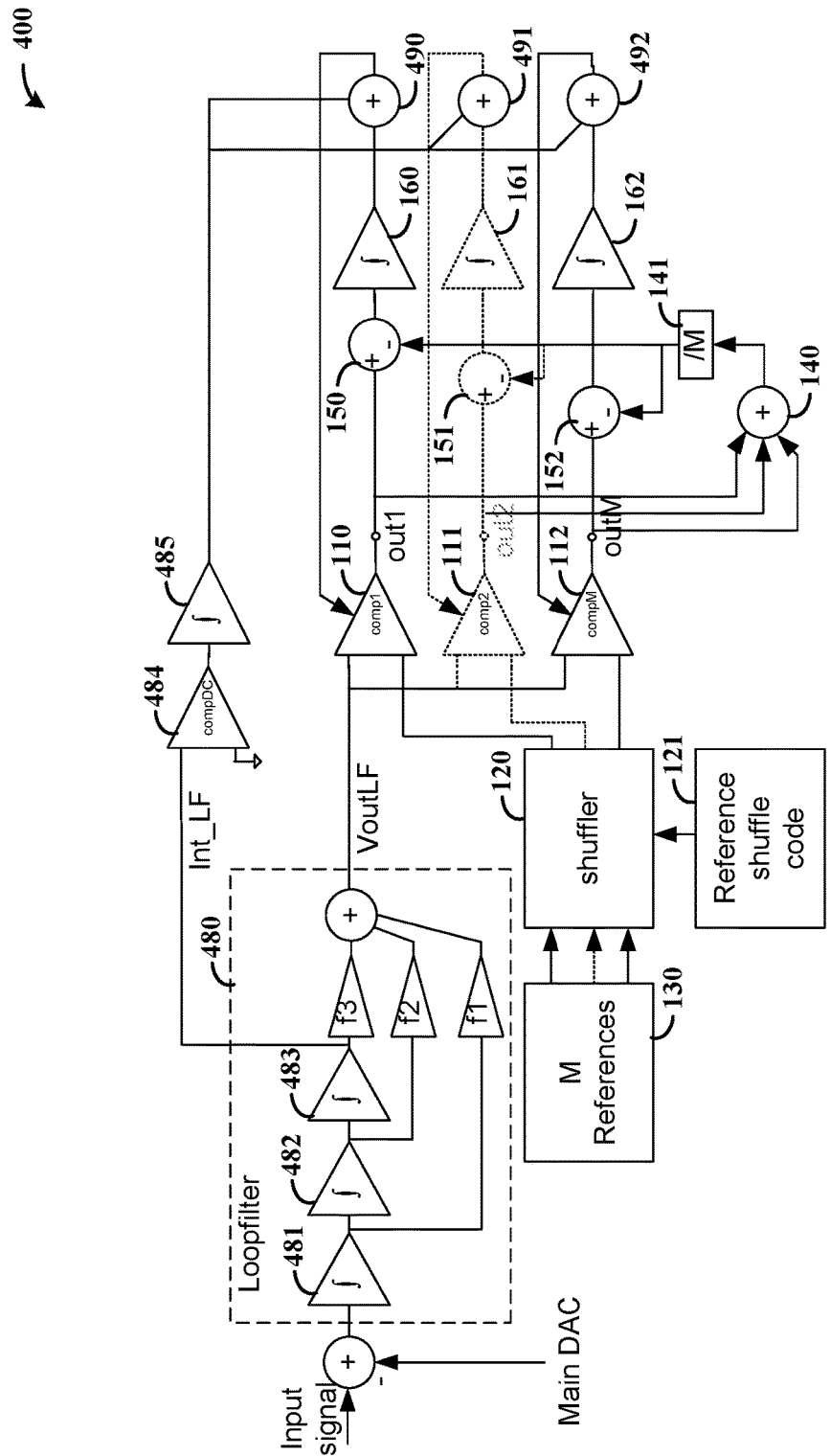
FIG. 4 is a circuit-based apparatus for offset compensation, in accordance with the present disclosure.

FIG. 4 shows a circuit-based apparatus 400 for common offset compensation, in accordance with the present disclosure. The apparatus 400 operates to assess and compensate for a common offset by measuring the common offset indirectly relative to the comparators for which the common offset is being utilized. Further, as the apparatus 400 may be implemented in accordance with the apparatuses 100 and/or 300 as depicted in FIGS. 1 and 3 with similar circuitry, similar reference numbers are used to depict similar circuitry, the description thereof being omitted for brevity.

The apparatus 400 includes loopfilter circuitry 480, with integrators 481, 482 and 483 having outputs respectively coupled to filters f1, f2 and f3, which are summed and output to each comparator 110-112. A further output (pre-filtered) is provided to an additional comparator 484, the output of which is provided to integrator 485 and as inputs to adder circuits 490, 491 and 492 within a feedback loop to the comparators 110-112. In this context, a common offset of a total quantizer may be measured indirectly, as the comparator 484 will have (over time) a number of high and low decisions corresponding to the other comparators. Accordingly, the auxiliary input of the comparators 110-112 is drive to adjust the offset upward or downward. In some implementations, the integration function can be implemented in the digital domain, and the auxiliary input stages for compensating the offset in the comparators can be implemented by offset DAC's that tune the offset of the comparators based on their input code.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, circuit and/or other circuit-type depictions (e.g., reference numerals 120 and 121 of FIGS. 1 and 3 depict a block/module as described herein). Such circuits or circuitry may be used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in the figures. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with the shuffling and compensation approaches noted herein is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as discussed herein and/or exemplified in the Figures may involve steps carried out in various orders, with one or more aspects of the embodiments herein retained, or may involve fewer or more steps. As another example, fewer or more comparators are used, or different offset approaches may be carried out. Such modifications do not depart from the true spirit and scope of various aspects of the disclosure, including aspects set forth in the claims.

What is claimed is:

1. An apparatus comprising:
   analog-to-digital conversion (ADC) circuitry, including a plurality of comparators susceptible to offset variation and including a shuffler circuit configured to shuffle input sources to the respective comparators; and
   feedback circuitry configured and arranged with the ADC circuitry to:
      detect offset variation in the outputs of each comparators for the shuffled inputs, relative to outputs of the plurality of comparators; and
      compensate for the offset variation in the comparators based on the offset differences between the respective comparators.

2. The apparatus of claim 1, wherein the feedback circuitry is configured and arranged with the ADC circuitry to detect the offset variation in the output of each comparator by averaging the outputs of the plurality of comparators and determining the offset variation of each comparator as a difference between the output of the comparator and the averaged outputs.

3. The apparatus of claim 1, wherein the feedback circuitry is configured and arranged with the ADC circuitry to compensate for residue offset common to the plurality of comparators by generating a feedback signal for each comparator based on the detected offset variation for that comparator and the residue offset.

4. The apparatus of claim 3, wherein the feedback circuitry is configured to:
   detect an amount of residue offset based on signal characteristics in a portion of the ADC circuitry that is different from the comparators; and
   compensate for the detected residue offset in the comparators.

5. The apparatus of claim 3, further including a feedback comparator coupled to receive an input signal provided to the plurality of comparators, and an integrator coupled to receive an output of the feedback comparator, wherein the feedback circuitry is configured to detect the residue offset in the apparatus using an output of the integrator.

6. The apparatus of claim 1, further including dither circuitry configured to add a known dither signal to the ADC circuitry.

7. The apparatus of claim 1, wherein the shuffler circuit is configured to randomly or pseudo-randomly shuffle the input sources to the respective comparators.

8. The apparatus of claim 1, wherein the feedback circuitry is configured and arranged with the ADC circuitry to compensate for the offset variation by, for each comparator, generating a feedback signal based on the detected offset variation for the comparator and using the feedback signal to compensate for the offset variation in the comparator.

9. The apparatus of claim 1, wherein the ADC circuitry and feedback circuitry are part of a multi-bit ADC quantizer.

10. The apparatus of claim 1, wherein the feedback circuitry includes:
    an adder circuit configured and arranged to add the outputs of the plurality of comparators;
    a divider circuit configured and arranged to divide the added outputs by the number of comparators to provide an averaging value; and
    for each comparator:
       summing circuitry configured and arranged to detect the offset variation in the comparator based on an output of the comparator and the averaging value, and to provide an output based on the offset variation; and
       integrator circuitry configured and arranged to integrate the output of the summing circuitry and provide the integrated output to the comparator as a feedback signal that adjusts the comparator to compensate for the offset variation.

11. A method comprising:
    in analog-to-digital conversion (ADC) circuitry including a plurality of comparators susceptible to offset variation and a shuffler circuit, using the shuffler circuit to shuffle input sources to the respective comparators; and
    in feedback circuitry,
       detecting offset variation in the outputs of each comparators for the shuffled inputs, relative to outputs of the plurality of comparators; and
       compensating for the offset variation in the comparators based on the offset differences between the respective comparators.

12. The method of claim 11, wherein detecting the offset variation in the output of each comparator includes averaging the outputs of the plurality of comparators and determining the offset variation of each comparator as a difference between the output of the comparator and the averaged outputs.

13. The method of claim 11, further including compensating for residue offset common to the plurality of comparators by generating a feedback signal for each comparator based on the detected offset variation for that comparator and the residue offset.

14. The method of claim 13, further including:
detecting an amount of residue offset based on signal characteristics in a portion of the ADC circuitry that is different from the comparators; and
compensating for the detected residue offset in the comparators.

15. The method of claim 13, further including detecting an amount of residue offset by detecting offset in a feedback comparator coupled to receive an input signal provided to the plurality of comparators.

16. The method of claim 11, further including adding a known dither signal to the ADC circuitry.

17. The method of claim 11, further including randomly or pseudo-randomly shuffling the input sources to the respective comparators.

18. The method of claim 12, wherein compensating for the offset variation includes, for each comparator, generating a feedback signal based on the detected offset variation for the comparator and using the feedback signal to adjust the comparator.

19. A method comprising:
randomly shuffling quantizer reference levels of respective comparators in a quantizer of a delta sigma analog-to-digital converter (ADC), therein interchanging offsets of the respective comparators;
compensating for offset in each of the comparators by, for each comparator, providing an auxiliary offset input to the comparator based on an offset of the comparator and an average offset of the comparators.

20. The method of claim 19, wherein compensating for the offset in each of the comparators includes removing offset differences between the comparators and removing noise generated via the random shuffling.

* * * * *